United States Patent [19]

Muri et al.

[11] Patent Number: 5,382,915

[45] Date of Patent: Jan. 17, 1995

[54] PULSEWIDTH-MODULATED AMPLIFIER HAVING ANALOG MODE

[75] Inventors: David L. Muri, Sunrise; Robert E. Stengel, Ft. Lauderdale, both of Fla.

[73] Assignee: Motorola, Inc., Schaumburg, Ill.

[21] Appl. No.: 85,900

[22] Filed: Jul. 6, 1993

[51] Int. Cl.⁶ .................. H03K 11/00; H03K 7/00; H03C 7/00

[52] U.S. Cl. .................. 330/10; 330/207 P; 330/120; 330/251; 330/146

[58] Field of Search .......... 330/10, 207 P, 146, 330/251; 381/120

[56] References Cited

U.S. PATENT DOCUMENTS 4,016,501  4/1977  Jasinski et al. .................. 330/10
5,115,205  5/1992  Holms, Jr. ........................ 330/10

*Primary Examiner*—William L. Sikes
*Assistant Examiner*—Fetsum Abraham
*Attorney, Agent, or Firm*—Pedro P. Hernandez

[57] ABSTRACT

An audio amplifier (100) switches between a pulse-width-modulated (PWM) mode to an analog mode when required in order to reduce unwanted EMI when the signals being reproduced fall within a predetermined threshold range such as when reproducing low amplitude signals. Amplifier (100) includes both a pulse-width-modulator (114) and a low-level analog amplifier (126) coupled to a speaker bridge circuit. When controller (106) determines that the input signal (102) is at a predetermined level, controller (106) selectively applies to the load (164) an analog signal instead of the PWM signal, this provides for improved dynamic range and reduced amplifier produced EMI.

21 Claims, 5 Drawing Sheets

402

502

602

TOTAL HARMONIC POWER GENERATED
VERSUS THE PULSE WIDTH

HIGHER HARMONIC TOTAL POWER
VERSUS PULSE WIDTH

PULSEWIDTH-MODULATED AMPLIFIER HAVING ANALOG MODE

TECHNICAL FIELD

This invention relates in general to amplifier circuits, and more specifically to pulsewidth-modulated (PWM) amplifier circuits.

BACKGROUND

Typically, when high frequency pulsewidth-modulated (PWM) amplifiers such as those employed in audio amplifier circuits are reproducing low amplitude signals, the PWM amplifiers will radiate unwanted emissions such as electromagnetic interference (EMI) due to the high current, narrow period pulse waveforms associated when reproducing such signals. A need thus exists in the art for a switching amplifier which can provide for both reduced emissions by eliminating the need for a PWM amplifier to generate narrow pulse widths such as those associated with reproducing low amplitude audio signals, as well as provide for increased dynamic range.

DETAILED DESCRIPTION OF THE PREFERRED EMBODIMENT

Figure 1:
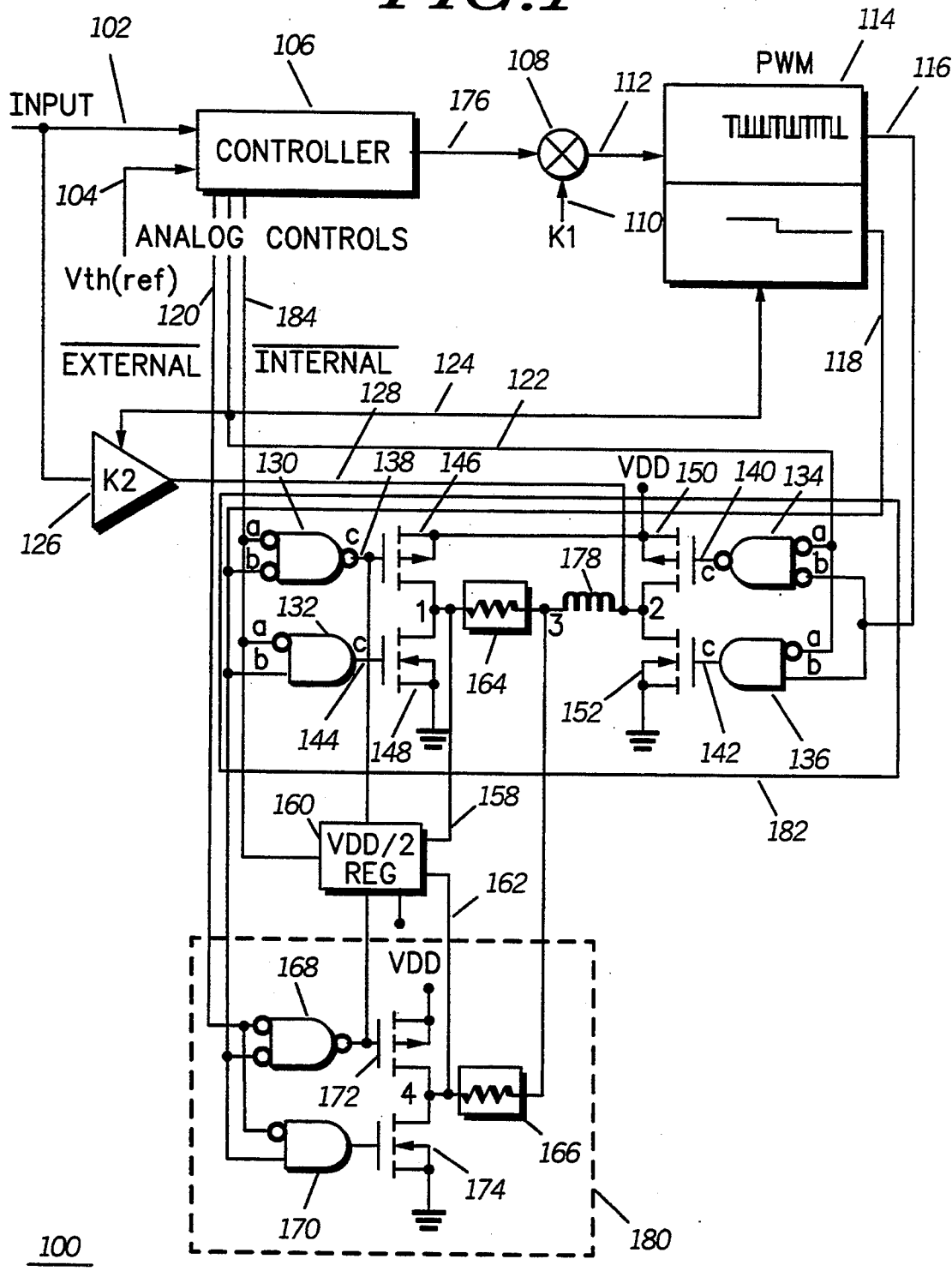
FIG. 1 is a block diagram of a PWM amplifier in accordance with the present invention.

While the specification concludes with claims defining the features of the invention that are regarded as novel, it is believed that the invention will be better understood from a consideration of the following description in conjunction with the drawing figures, in which like reference numerals are carried forward.

Figure 7:
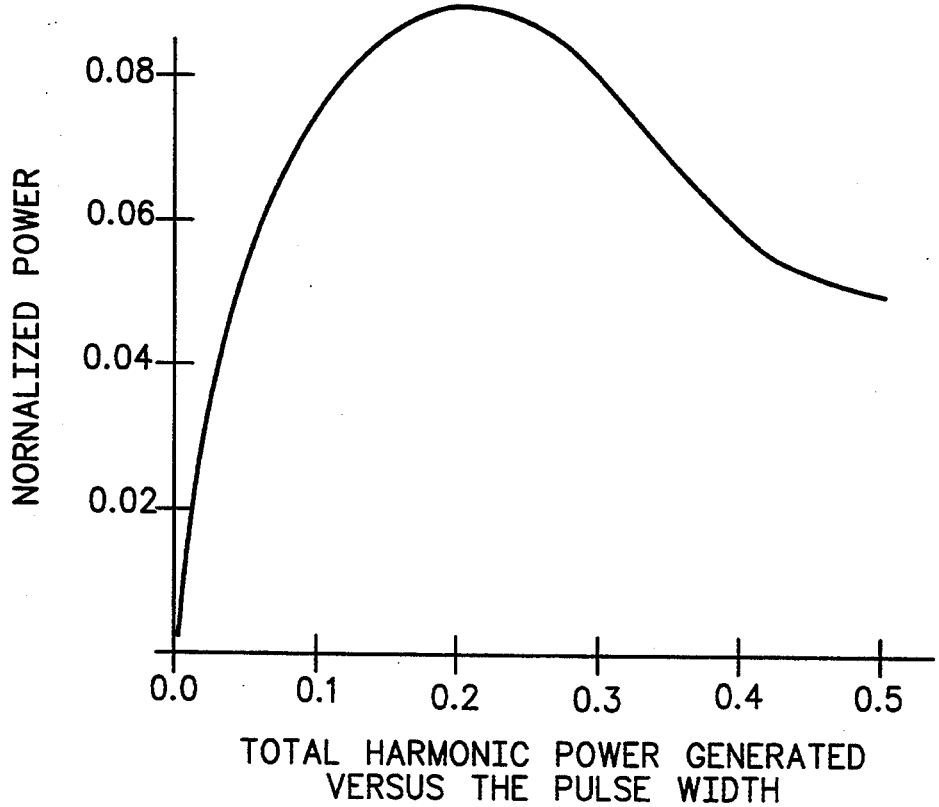
FIG. 7 shows a graph of total harmonic power generated versus the pulse width of the amplifier.

As the current conduction duration of a PWM two state signal decreases relative to the switching period, the harmonic content becomes a higher percentage of the total signal potential. In order to determine the potential electromagnetic interference (EMI) potential of a pulse width or duration modulated signal, one must determine the fourier components of a periodic pulsed signal with a variable pulse duration. The total harmonic (e.g., n=2 to 100) power available to a resistive frequency independent load is summed as the pulse duration is varied. The results indicated that the harmonic power or potential electromagnetic interference reaches a maximum value for a pulse duration of $t/T_o$ (where t is the "on" time and $T_o$ is the time for one cycle) of approximately 0.2, as shown in FIG. 7. This represents the potential undesired self-generated interference power available, normalized to the maximum DC power of a pulse width modulated signal.

The harmonic power dissipation can be reduced in an audio amplifier by including an inductor in series with the resistive load. This will result in a desirable efficiency improvement since the harmonic currents, which are not any part of the intended signal, are reduced in the resistive load. However, the introduction of an inductor can increase the electromagnetic radiation of the undesired harmonics into other circuits in close proximity to the audio amplifier. The best solution against the electromagnetic interference is not to generate the signals at all or reduce the magnitude of the source. By determining the harmonic potential as a function of the pulse duration, alternatives can be applied to the function to eliminate the use of short duration pulse width modulation signals.

In a two state PWM signal following the function $$f(t) = \begin{cases} 2A & |t| \leq \tau/2 \\ -A\ T_o \geq |t| > \tau/2 \end{cases}$$

the following equations represent the two sided voltage magnitude components of the signal:

$$c(nf) = |\tau\{f(t)\}| = \frac{1}{T_o} \int_{-T_o/2}^{T_o/2} f(t)\ e^{-j2\pi nf_o t}\ dt \qquad \text{Eq. 1}$$

$$= \frac{1}{T_o} \int_{-T_o/2}^{T_o/2} A\ e^{-j2\pi nf_o t}\ dt$$

$$= \frac{A}{-j2\pi nf_o T_o} (e^{-j\pi nf_o \tau} - e^{j\pi nf_o \tau})$$

$$= \frac{A}{\pi n} \sin(\pi n \tau/T_o)$$

where $f_o = 1/T_o$ and $n = \pm 1, \pm 2, \pm 3, \ldots, \pm \infty$.

The Fourier series signals of the pulse width modulated signal shown in FIG. 7, is represented by equation 2 (Eq. 2) below.

$$\tau\{f(t)\} = 2 \sum_{n=1}^{\infty} \frac{A}{\pi n} \sin(\pi n \tau/T_o) \cos\left(\frac{2\pi n}{T_o} t\right) \qquad \text{Eq. 2}$$

where, $T_o = A = 1$ for normalization.

Figure 8:
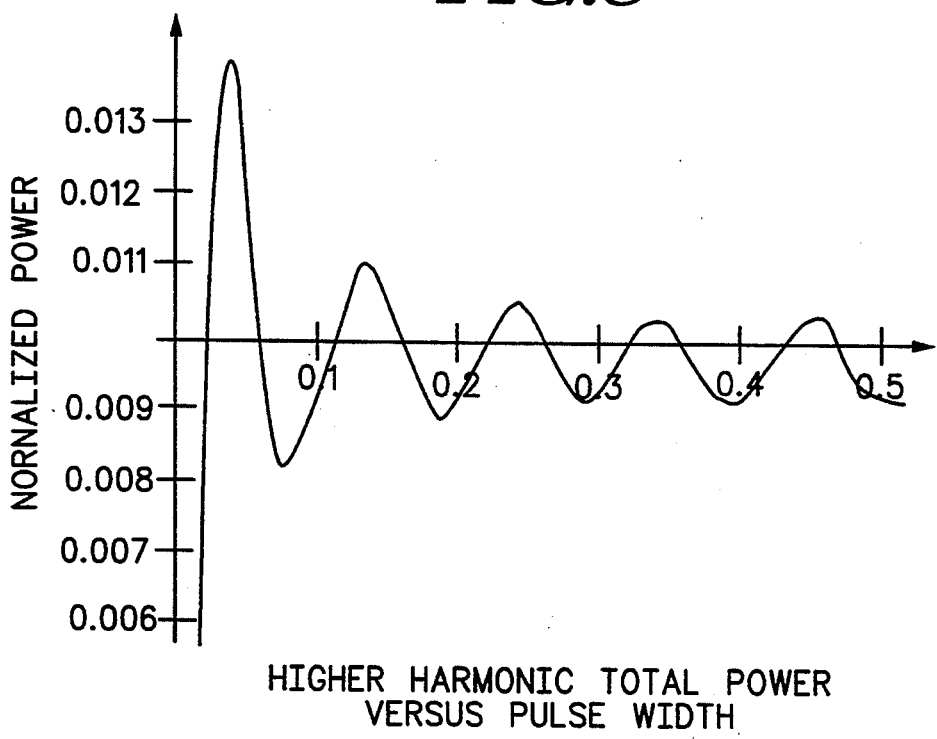
FIG. 8 shows another graph of harmonic power versus pulse width.

The magnitude of the harmonics in equation 2 are the peak voltage potentials. The normalized harmonic component available power is determined by squaring equation 2 magnitude terms divided by $\sqrt{2}$. The harmonics above the second are then summed and plotted as $t/T_o$ is varied from 0.5 to 0.05. FIG. 8 is a plot similar to the plot shown in FIG. 7, except that in FIG. 8, the initial harmonic considered in the summation is increased to (n=10 to 100) from the summation (n=2 to 100) of FIG. 7. This results in a lower potential interference and value $t/T_o$ for maximum EMI potential.

The conclusion from the above analysis is that improvement in EMI can be optimized and the impact on the efficiency of the audio amplifier minimized, by restricting the minimum pulse duration used in a PWM amplifier system. Selection of the minimum pulse duration would be a function of the EMI harmonic being considered and the level of EMI rejection required in the system.

Referring now to FIG. 1, a PWM audio amplifier 100 in accordance with the present invention is shown. Audio amplifier 100 can be an audio amplifier such as those used in two-way radios or other electronic devices. In the preferred embodiment, input signal 102 which is received by audio amplifier 100 is an analog audio signal 102 such as a voice signal which varies in both level and frequency. Audio signal 102 is typically generated by the radio's receiver section (not shown) whenever a message is received by the receiver. For purposes of the following discussion, the audio signal is assumed to be a standard AC signal having a DC offset equaling the supply voltage of the amplifier circuit divided by two (Vdd/2), as is common to operational amplifier outputs.

Controller 106 preferably comprises a microcomputer such a MC68HC11 microcomputer (manufactured by Motorola, Inc.) having an analog-to-digital (A/D) converter section, as well as onboard memory and input/output capabilities. Input signal 102 is converted into a digital bit stream 176 by the A/D converter section found in controller circuit 106. Digital bit stream 176 is then sent to a digital mixer 108 which mixes the digital bit stream with a digital gain factor signal 110 represented as signal K1. Gain factor signal K1 provides a gain adjustment to the audio signal represented by digital bit stream 176.

In the case that amplifier 100 in a digital radio, variable input signal 102 coming from the radio's receiver section will be a digital signal carrying both frequency and level information. In such a case, the analog to digital conversion performed by controller 106 is not required and the digital signal is sent directly to mixer 108. However, in a digital radio embodiment where input signal 102 is a digital signal, the digital signal will have to be converted into analog form using a conventional digital-to-analog (D/A) converter prior presenting the to amplifier 126, as will be become apparent later in the description of the present invention.

Figure 2:
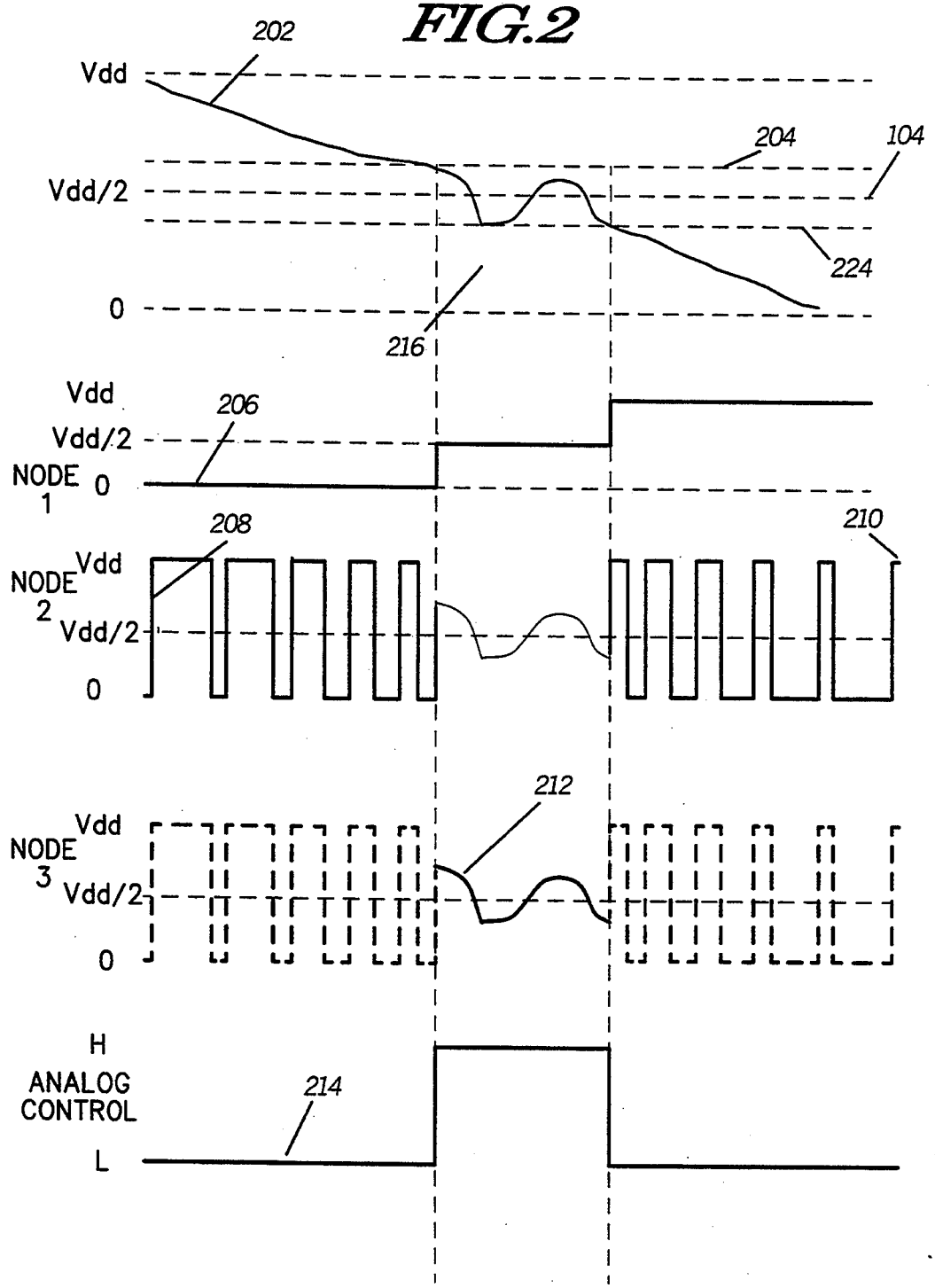
FIG. 2 is a chart showing several waveforms illustrating the operation of the system of FIG. 1.

The amplified digital bit stream 112 is then sent to a PWM circuit 114 which receives digital bit stream 112 and provides a PWM output signal 116 and a two-state digital signal 118. A threshold voltage reference signal 104 is also provided to controller 106. Threshold signal 104 can originate from anyone of a number of well known adjustable reference voltage circuits, as well as it can be internally generated by controller 106 and be adjustable by the amplifier user. In the preferred embodiment, digital signal 118 provides a voltage equal to supply voltage Vdd (a logic High signal) when input signal 102 has a magnitude which is a predetermined amount greater than threshold voltage 104, and a low logic signal (zero volts), when the input signal's magnitude is a predetermined amount below threshold voltage 104. In the preferred embodiment, threshold voltage 104 is received by controller 106 which in turn generates a voltage range by adding and subtracting predetermined amounts in order to generate upper voltage threshold 204 and lower voltage threshold 224 (as shown in FIG. 2). Preferably, threshold voltage 104 is set at Vdd/2. Circuits 108 and 114 although shown as separate circuits, could also been implemented using controller 106 in order to further integrate the amplifier circuit.

PWM signal 116 is provided to one side of speaker bridge network 182, while digital signal 118 is provided to the other side of speaker bridge network 182. Speaker bridge network 182 comprises logic gates 130–136. Logic gates 130–136 and 168–170 help form tri-state bridge drivers using FETs 146–152 and 172–174. The output signals 138–144 of digital logic gates 130–136 provide the control signals to an amplifier bridge circuit, which is comprised of power switches such as field-effect transistors (FETs) 146–152, inductor 178 and an amplifier load such as speaker 164.

Control signal 122 which is generated by controller 106, and PWM signal 116 generated by pulsewidth-modulator circuit 114, control the operation logic gates 134 and 136. While control signals 184 and 118 control the operation of logic gates 130 and 132. Tables 1, shows the control logic for N-channel FETs 148 and 1152, while TABLE 2, shows the control logic for P-channel FETs 146 and 150. Symbols "a" and "b" in Tables 1 and 2, designate the input terminals for the logic gates 130–136 as shown in FIG. 1, and symbol "c" designates the logic gate's output terminals. The full operation of speaker bridge 182 will be discussed in detail latter on.

TABLE 1

| a | b | c | |
|---|---|---|---|
| 0 | 0 | 0 | - N ch "off" load high |
| 1 | 0 | 0 | |
| 0 | 1 | 1 | - N ch "on" load low |
| 1 | 1 | 0 | |

TABLE 2

| a | b | c | |
|---|---|---|---|
| 0 | 0 | 0 | - P ch "on" load high |
| 1 | 0 | 1 | - P ch "off" load low |
| 0 | 1 | 1 | |
| 1 | 1 | 1 | |

The present invention provides for an improvement in performance over known PWM audio amplifiers by selectively applying either an analog or PWM signal to at least one of the speaker terminals. In FIG. 1, one speaker terminal is so driven, and is designated as node 2. The other speaker terminal designated in FIG. 1, as node 1, is switched between supply voltage, half supply voltage and ground. By doing this, audio amplifier 100 provides for improved dynamic range and reduces unwanted interference signals during portions of its operation. The analog signal which is selectively sent to node 2 is the input audio signal 102 which is passed through a gain stage such as an operational amplifier 126 prior to being sent to node 2. This amplified signal is only sent to node 2 when input signal 102 is determined to have a predetermined low magnitude by controller 106. Control circuit 106 controls gain stage 126 in determining when to allow the analog signal to reach node 3. Although in the preferred embodiment only node 2 is selectively applied an analog or PWM signal, one could very easily apply the selectively applied signals to both of the speaker terminals (nodes 2 and 3).

Amplifier 100 further includes a voltage regulator 160 which is controlled by controller 106, and provides in the preferred embodiment, a regulated voltage equaling VDD/2 to node 1 during certain periods of operation. Amplifier circuit 100 also includes an optional external speaker driver circuit 180, which helps drive an external speaker 166. An external speaker is used in radio applications whenever a user wants to couple an earpiece or other audio device to the radio. In a typical radio application, speaker 164 is located inside of the radio, while external speaker circuit 180 is accessed via a speaker/earpiece connector. Load 166 depicts the external speaker in the external earpiece or the speaker in an external microphone/speaker which is typically used in radio communication devices, such as portable two-way radios. Driver circuit 180 includes a pair of logic gates 168 and 170 which are connected in parallel to gates 130 and 132. Logic gate 168 controls FET 172, while logic gate 170 controls FET 174. Control signal 120 (external) which is generated by controller 106 controls the operation of the gates.

A voltage equaling VDD/2 162 is selectively applied to circuit 180 whenever controller 106 determines that the analog input signal is within the predetermined amplitude range (e.g., input signal has an amplitude which falls within the predetermined threshold range). As shown in FIG. 1, amplifier 100 has been configured to keep the voltage on the inductor and speaker common node (node 3), between Vdd (supply voltage) and ground potential. This prevents a negative voltage from occur at node 3. Amplifier 100 is also configured to allow single ended analog injection, allowing for the use of internal or external speakers and integration using standard CMOS technology.

Referring now to FIG. 2, a set of waveforms are shown in order to better illustrate the operation of amplifier 100. Input signal 102 is shown in FIG. 2 as analog signal waveform 202. The present invention uses the voltage threshold signal 104 (shown in FIG. 1) which is used by control circuit 106 in order to establish a voltage range 216 established by threshold levels 204 (upper threshold) and 224 (lower threshold). When input signal 202 is outside of the voltage range established by thresholds 204 and 224, node "1" does not have a voltage applied by regulator 160 as shown by line 206. However, when the audio signal 202 falls inside of range 216, voltage regulator 160 is turned on by controller 106 in order to provide one half of the supply voltage to node 1, as well as to node 4 in the optional external speaker circuit 180 if needed. As shown by waveform 206, when the input signal is greater than upper threshold voltage level 204, node 1 will be at ground potential, when input signal is within threshold range 216 it will have a voltage of Vdd/2 which is applied by regulator 160, and finally, when input signal 202 is below lower threshold level 224, node 1 will have a voltage of Vdd. Although in FIG. 2 we have discussed signal 102 as an analog signal having a variable voltage level, input signal 102 could also be a digital signal carrying level and frequency information as typically found in digital radios which receive digital transmissions. In this case controller 106 would have to decode the level from the signal in order to provide the same information provided by the voltage level in the case that input signal 102 is an analog signal. Finally, instead of comparing the level of the input signal as discussed in FIG. 2, controller could determine the magnitude of the input signal and compare it to a single threshold level and not a range as shown in FIG. 2. Those skilled in the art will realize that there are many ways of making the switching determination required of the present invention.

Waveform 208 shows the PWM signal which is applied to node 2, during the portion of time input signal 202 is greater than upper threshold voltage level 204. During that input signal 102 is within voltage range 216, controller 106 provides a control signal 214 (shown as signals 122 in FIG. 1) which causes analog gates 134 and 136 to float and gain stage 126 to turn on. During this particular period of time, amplified analog signal 128 is provided to node 3 by gain stage 126, voltage regulator 160 provides the Vdd/2 voltage to node 1, and control signal 214 causes FETs 150 and 152 to float.

By selectively choosing whether to apply a PWM signal or an analog signal to speaker 164, the present invention provides for improved dynamic range as compared to a conventional PWM amplifier design, as well as helps reduce unwanted interference generated by the amplifier. The present invention eliminates the need to generate the narrow pulse widths associated with low amplitude signals, thereby reducing the chances of amplifier 100 generating unwanted electromagnetic interference (EMI).

Figure 3:
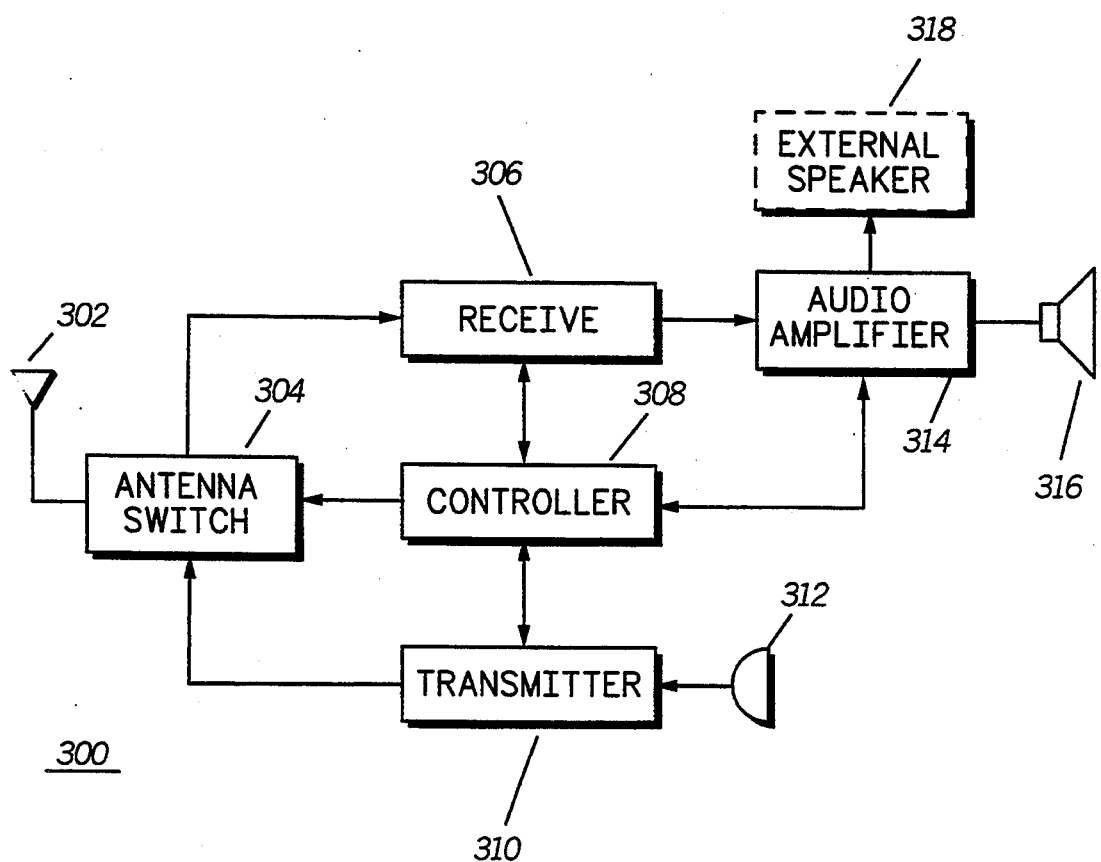
FIG. 3 is a block diagram of a radio incorporating the PWM amplifier of the present invention.

In FIG. 3, a block diagram of a communication device such as a two-way radio 300 is shown. Radio 300 comprises an antenna 302 used in the receiving and transmitting of radio frequency signals. Antenna 302 is selectively coupled to receiver 306 and transmitter 310. Both receiver 306 and transmitter 310 sections are well known FM sections. Receiver 306 and transmitter 310 are under the control of a controller circuit 308 such as a MC68HC11 microcomputer having onboard I/O and memory. Connected to transmitter 310 is a microphone 312 which allows the radio user to send voice messages via transmitter 310 whenever the radio's push-to-talk switch (not shown) is depressed.

Connected to receiver 306 is a PWM audio amplifier circuit 314 such as the audio amplifier circuit 100 shown in FIG. 1. Coupled to audio amplifier 314 is a speaker 316 which is located inside of the radio. Audio amplifier circuit 314 can accept an optional external speaker or earpiece 318. Whenever speaker 318 is coupled to amplifier 314, internal speaker 316 is decoupled by amplifier 314 by controller 106 by use of control signals 120 and 184.

Figure 4:
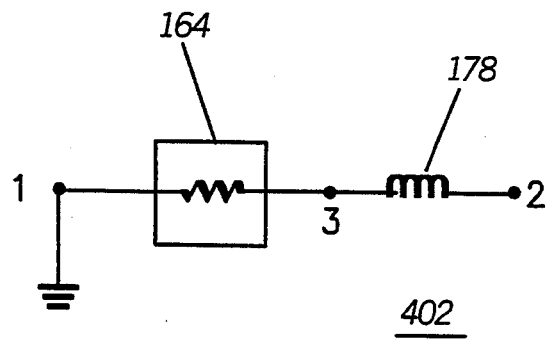
FIG. 4-6 show electrical models of the speaker load in accordance with the present invention.

In FIG. 4, an electrical model of the speaker load during the time that input signal 202 is above upper threshold level 204 is shown. During this particular period of time, node 1 is placed at ground potential, while node 2 is provided with the PWM signal which reaches speaker 164 via inductor 178.

Figure 5:
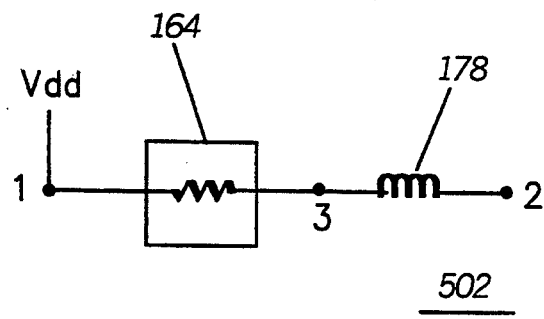
Figure 6:
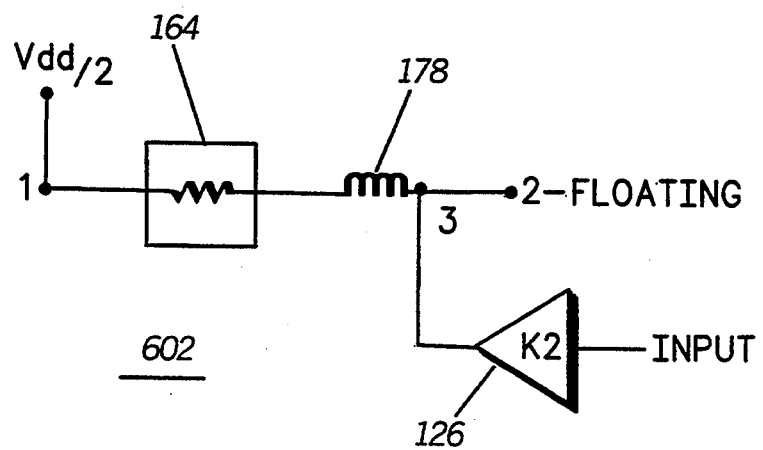

Referring now to FIG. 5, this model shows how speaker 164 is driven during the time that input signal 202 has an amplitude less than lower threshold level 224 (waveform to the right of range 216). During this portion of waveform 202, node 1 is placed at Vdd (supply potential) while the PWM signal is applied to node 2.

During the time that waveform 202 is inside of range 216 (the magnitude of input signal 202 is between upper threshold level 204 and lower threshold level 224), node 1 is placed at a voltage equal Vdd/2 while the other side of speaker 164 is driven by the amplified analog input signal 128. Amplifier circuit 100 provides for improved dynamic range by selectively applying analog or PWM signals to one speaker terminal. As described above, when the desired output is below a certain level, PWM circuit 114 is switched off and the output of low power analog amplifier 126 is fed to speaker 164. This eliminates the narrow pulses associated with low amplitude signals, thereby helping to reduce high frequency EMI emissions from being generated by amplifier 100. The present invention provides for improvement in the dynamic range of the amplifier, as well as allows for inductive filtering without the use of negative voltages.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. An audio pulsewidth-modulated (PWM) amplifier comprising:

an input terminal for receiving an input signal having a variable level;

a controller coupled to the input terminal and responsive to the input signal for comparing the level of the input signal to a threshold range;

a pulsewidth-modulator responsive to the controller for receiving the input signal and generating a pulsewidth-modulated signal corresponding to the input signal;

first and second load terminals coupled to the pulsewidth modulator; and said controller providing the pulsewidth-modulated signal to the second load terminal when the level of the input signal is outside of the threshold range, and proving the input signal to the second load terminal when the level of the input signal is within the threshold range.

2. An audio pulsewidth-modulated (PWM) amplifier as defined in claim 1, further comprising:

a gain stage coupled to the input terminal, said gain stage responsive to the controller for amplifying the input signal prior to providing the input signal to the second load terminal when the level of input signal is within the threshold range.

3. An audio amplifier as defined in claim 1, wherein the threshold range comprises upper and lower threshold levels, and the controller provides the input signal to the second load terminal when the level of the input signal is within or equal to the upper and lower threshold levels.

4. An audio pulsewidth-modulated (PWM) amplifier as defined in claim 1, further comprising:

a speaker coupled between the first and second load terminals.

5. An audio pulsewidth-modulated (PWM) amplifier as defined in claim 1, wherein the input signal is a digital signal.

6. An audio pulsewidth-modulated (PWM) amplifier as defined in claim 1, wherein the controller also provides the pulsewidth-modulated signal signal to the first load terminal.

7. An audio pulsewidth-modulated (PWM) amplifier as defined in claim 3, wherein the controller places the first load terminal at a first voltage potential when the level of the input signal is greater than the upper threshold, at a second voltage potential when the level of the input signal is less than the lower threshold level, and at a third voltage potential when the level of the input signal is within the voltage range or equal to the upper or lower threshold levels.

8. An audio pulsewidth-modulated (PWM) amplifier as defined in claim 7, wherein the first voltage potential is set at ground potential, the second voltage potential is set at a first voltage potential which is also and the third voltage potential is set at half the first voltage potential.

9. A communication device, comprising:

a receiver section which provides a signal having a variable magnitude; and an audio pulsewidth-modulated (PWM) amplifier responsive to the signal, comprising:

an input terminal for receiving the signal;

a controller means coupled to the input terminal and responsive to the signal for comparing the magnitude of the signal to a predetermined threshold;

a pulsewidth-modulator responsive to the controller for receiving the signal and generating a pulsewidth-modulated signal corresponding to the signal;

first and second load terminals coupled to the pulsewidth modulator; and said controller providing the pulsewidth-modulated signal to the second load terminal when the magnitude of the input signal is greater than the predetermined threshold, and proving the signal to the second load terminal when the magnitude of the signal is equal to or less than the predetermined threshold.

10. A communication device as defined in claim 9, further comprising:

a speaker coupled between the first and second load terminals.

11. A communication device as defined in claim 10, further comprising:

a bridge circuit coupled to the first and second load terminals and responsive to the input signal for driving the speaker.

12. An audio pulsewidth-modulated (PWM) amplifier comprising:

an input terminal for receiving an input signal having a variable voltage level;

a controller coupled to the input terminal and responsive to the input signal for comparing the voltage level of the input signal to a voltage threshold range;

a pulsewidth-modulator responsive to the controller for receiving the input signal and generating a pulsewidth-modulated signal corresponding to the input signal;

a speaker;

a bridge circuit for driving the speaker; and said controller providing the pulsewidth-modulated signal to the speaker bridge when the voltage level of the input signal is outside of the threshold range, and providing the speaker with the input signal when the voltage of the input signal is within the threshold range.

13. An audio pulsewidth-modulated (PWM) amplifier as defined in claim 12, further comprising:

a gain stage coupled to the input terminal, said gain stage responsive to the controller for amplifying the input signal prior to providing it to the speaker when the voltage level of the input signal is within the threshold range.

14. An audio pulsewidth-modulated (PWM) amplifier as defined in claim 12, wherein the speaker is coupled between first and second load terminals, and the voltage threshold range comprises upper and lower voltage threshold levels, and the controller places the first load terminal at a first voltage potential when the voltage level of the input signal is greater than the upper voltage threshold level, at a second voltage potential when the voltage of the input signal is less than the lower voltage threshold level, and at a third voltage potential when the voltage of the input signal is within the voltage threshold range.

15. A method for reducing emissions in a pulsewidth-modulated (PWM) amplifier, comprising the steps of:

receiving an input signal having a variable level;

determining if the level of the input signal falls within a predetermined threshold range;

providing a PWM signal which corresponds to the input signal to a load if the level of the input signal is determined not to fall within the predetermined threshold range; and providing the input signal to the load if the variable input signal is determined to fall within the predetermined threshold range.

16. A method for reducing emissions in a pulsewidth-modulated (PWM) amplifier as defined in claim 15, wherein the step of providing the variable input signal to the load, comprises the further step of:

amplifying the input signal prior to providing the input signal to the load.

17. A method for reducing emissions in a pulsewidth-modulated (PWM) amplifier as defined in claim 15, wherein the load is a speaker.

18. A method for reducing emissions in a pulsewidth-modulated (PWM) amplifier as defined in claim 15, wherein the input signal is a digital signal having level information.

19. A radio, comprising:

a receiver; and an audio amplifier, the audio amplifier comprising:

an input terminal for receiving an input signal having a variable level from the receiver;

a controller coupled to the input terminal and responsive to the input signal for comparing the input signal to a threshold range;

a pulsewidth-modulator responsive to the controller for receiving the input signal and generating a pulsewidth-modulated signal corresponding to the input signal;

first and second load terminals coupled to the pulsewidth modulator; and said controller providing the pulsewidth-modulated signal to the second load terminal when the level of the input signal is outside of the threshold range, and providing the input signal to the second load terminal when the input signal is within the threshold range.

20. A radio as defined in claim 13, further comprising:

a gain stage coupled to the input terminal, said gain stage responsive to the controller for amplifying the input signal prior to providing it to the second load terminal when the input signal is within the threshold range.

21. A radio as defined in claim 13, further comprising:

a speaker coupled between the first and second load terminals.

* * * * *